United States Patent
Drerup et al.

(10) Patent No.: US 7,003,064 B2
(45) Date of Patent: Feb. 21, 2006

(54) METHOD AND APPARATUS FOR PERIODIC PHASE ALIGNMENT

(75) Inventors: Bernard Charles Drerup, Austin, TX (US); Richard Siegmund, Jr., Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 920 days.

(21) Appl. No.: 10/042,098

(22) Filed: Jan. 7, 2002

(65) Prior Publication Data

US 2003/0128789 A1 Jul. 10, 2003

(51) Int. Cl.
*H04L 25/00* (2006.01)
*H04L 25/40* (2006.01)
*H04L 7/00* (2006.01)

(52) U.S. Cl. .................. 375/371; 375/348; 375/358; 375/371; 327/141; 370/503; 709/248

(58) Field of Classification Search ............... 375/371, 375/348, 358; 327/141; 370/503; 709/248
See application file for complete search history.

(56) References Cited

U.S. PATENT DOCUMENTS 5,272,391 A * 12/1993 Ampe et al. ................ 327/141
2002/0034219 A1 * 3/2002 Agazzi ....................... 375/219
2002/0110212 A1 * 8/2002 Lysdal et al. ............... 375/371
2004/0264619 A1 * 12/2004 Bonaccio et al. ........... 375/373

OTHER PUBLICATIONS

U.S. Appl. No. 09/732,000, filed Dec. 7, 2000, Drerup et al.

* cited by examiner

*Primary Examiner*—Stephen Chin
*Assistant Examiner*—Erin M. File
(74) *Attorney, Agent, or Firm*—Robert M. Carwell; Anthony V. S. England

(57) ABSTRACT

In one form, apparatus for aligning clock signals includes first and second logic circuitry for receiving respective first and second clock signals. The first and second clock signals are substantially synchronized and operations of the first logic circuitry and second logic circuitry are clocked by the respective first and second clock signals. The first logic circuitry receives a third clock signal derived from the second clock signal, and by repeatedly sampling the third clock signal with the first clock signal, the first logic circuitry repeatedly detects relative phase relations of the first and third clock signals. The second logic circuitry adjusts the phase of the third clock signal responsive to an accumulation of the phase relation detecting.

20 Claims, 7 Drawing Sheets

METHOD AND APPARATUS FOR PERIODIC PHASE ALIGNMENT

CROSS-REFERENCE TO RELATED APPLICATION

This application is related to the following application assigned to the same assignee as the present application and which is hereby incorporated herein by reference: "Dynamic Phase Alignment Circuit," application Ser. No. 09/732,000, filed Dec. 7, 2000.

BACKGROUND

1. Field of the Invention

This invention relates to clock phase alignment, and more particularly to clock phase alignment for clocks derived from a common source but which, due to differing clock frequencies, are seldom, if ever, aligned with one another.

2. Related Art

Computer systems have numerous subsystems and components, some of which operate at different clock speeds. For example, a central processing unit ("CPU") may operate at 500 MHz, while a memory unit operates at 100 MHz. This is true for a system with numerous discrete components as well as a system-on-chip ("SOC") that is highly integrated and has a number of different subsystems on a single chip.

It is common in SOC clocking systems and other systems to use a single phase locked loop ("PLL") as a source to create numerous primary clocks with different frequencies. It is also common to derive other clocks from the primary clocks by additional clock generation logic circuitry. To achieve efficient communication in such systems it is often necessary to phase align all these clocks. However, while PLL's generally ensure phase alignment among such primary clocks, they cannot guarantee phase alignment in the other clocks derived from the primary clocks.

Since these clocks do not all have the same frequency, it is difficult to periodically align them. That is, many conventional circuits for aligning clocks depend on the clocks sharing a fundamental frequency. Also, many conventional phase alignment circuits are too slow to align high speed clocks. Thus, a need exists for methods and circuitry for aligning high-speed clocks, particularly if the clocks have different frequencies.

DETAILED DESCRIPTION OF THE PREFERRED EMBODIMENT

The claims at the end of this application set out novel features which applicants believe are characteristic of the invention. The invention, a preferred mode of use, objectives and advantages, will best be understood by reference to the following detailed description of an illustrative embodiment read in conjunction with the accompanying drawings.

Figure 1:
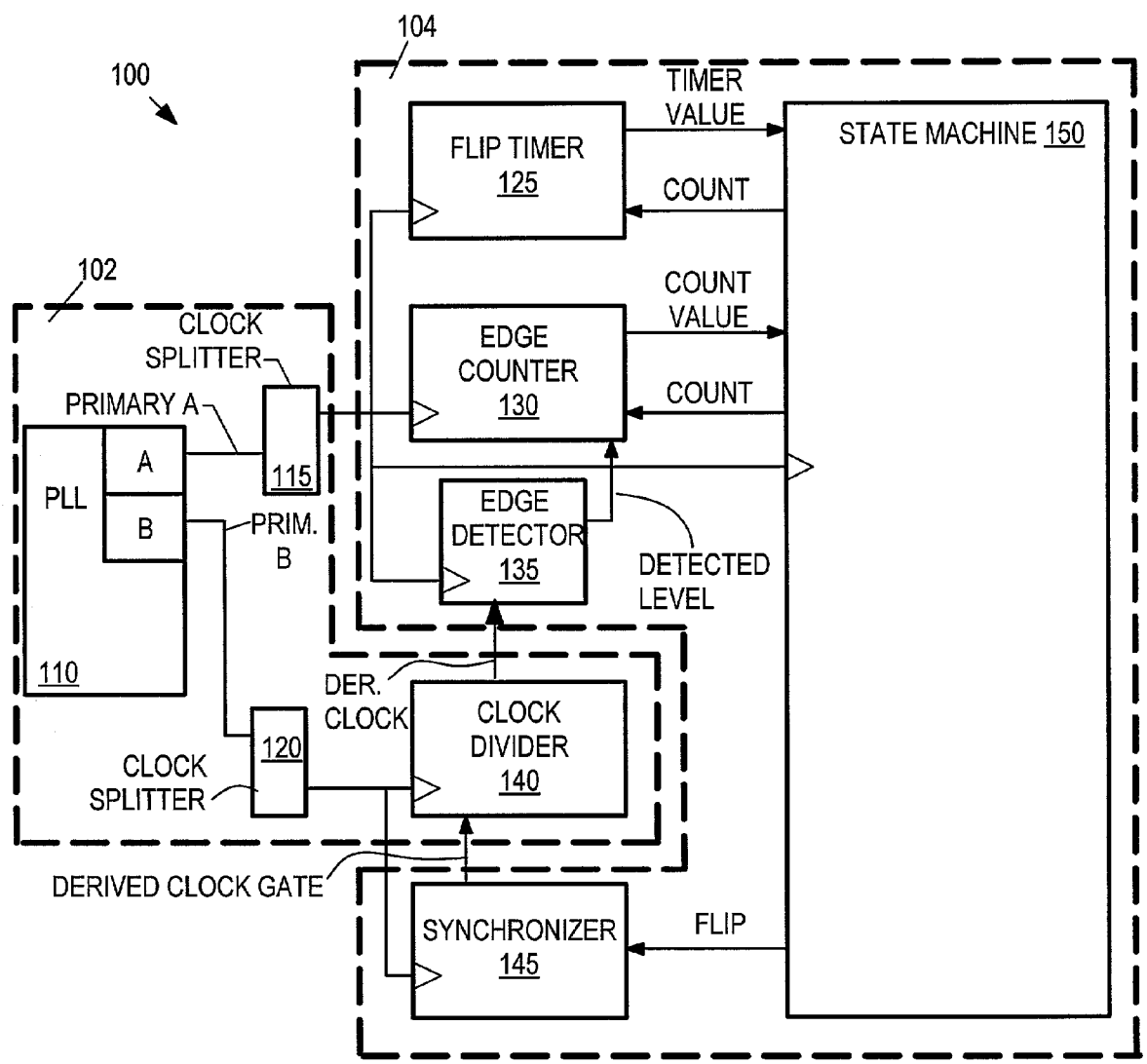
FIG. 1 illustrates logic, including a state machine, for aligning clock signals, according to an embodiment.

Referring now to FIG. 1, logic 100 is shown, according to an embodiment. Logic 100 includes logic 102 for generating two primary clock signals and a "derived" clock signal that is derived from one of the primary clock signals. The derived clock signal is aligned by logic 104 to ensure that it is periodically in phase with the other primary clock signal. More specifically, logic 102 includes a PLL 110 which outputs the two primary clocks for use in a system, such as a computer system, application specific integrated circuit ("ASIC"), etc. The first primary clock is labeled "primary A." The second primary clock is labeled "primary B." Each of the two primary clocks is fed to a respective clock splitter 115 and 120 of logic 102, for driving multiple, non-overlapping instances of each primary clock. Instances of the primary A clock are shown output by clock splitter 115 to flip timer 125, edge counter 130 and edge detect flip-flop 135 of alignment logic 104. Instances of the primary B clock are shown output by clock splitter 120 to clock divider 140 of logic 102 and synchronizer 145 of logic 104 primary A and primary B clocks are also used by logic in other parts of the system, as shown.

Clock divider 140 generates the derived clock from the primary B clock for use elsewhere in the system. In addition, the derived clock is fed to the edge detect flip-flop 135 of logic 104. Logic 104 compares the derived clock with the primary A clock and generates a derived clock gating signal to the clock divider 140 of the clock generating logic 110 for aligning, i.e., phase adjusting, the derived clock so that it is periodically in phase with primary A clock.

Figure 3:
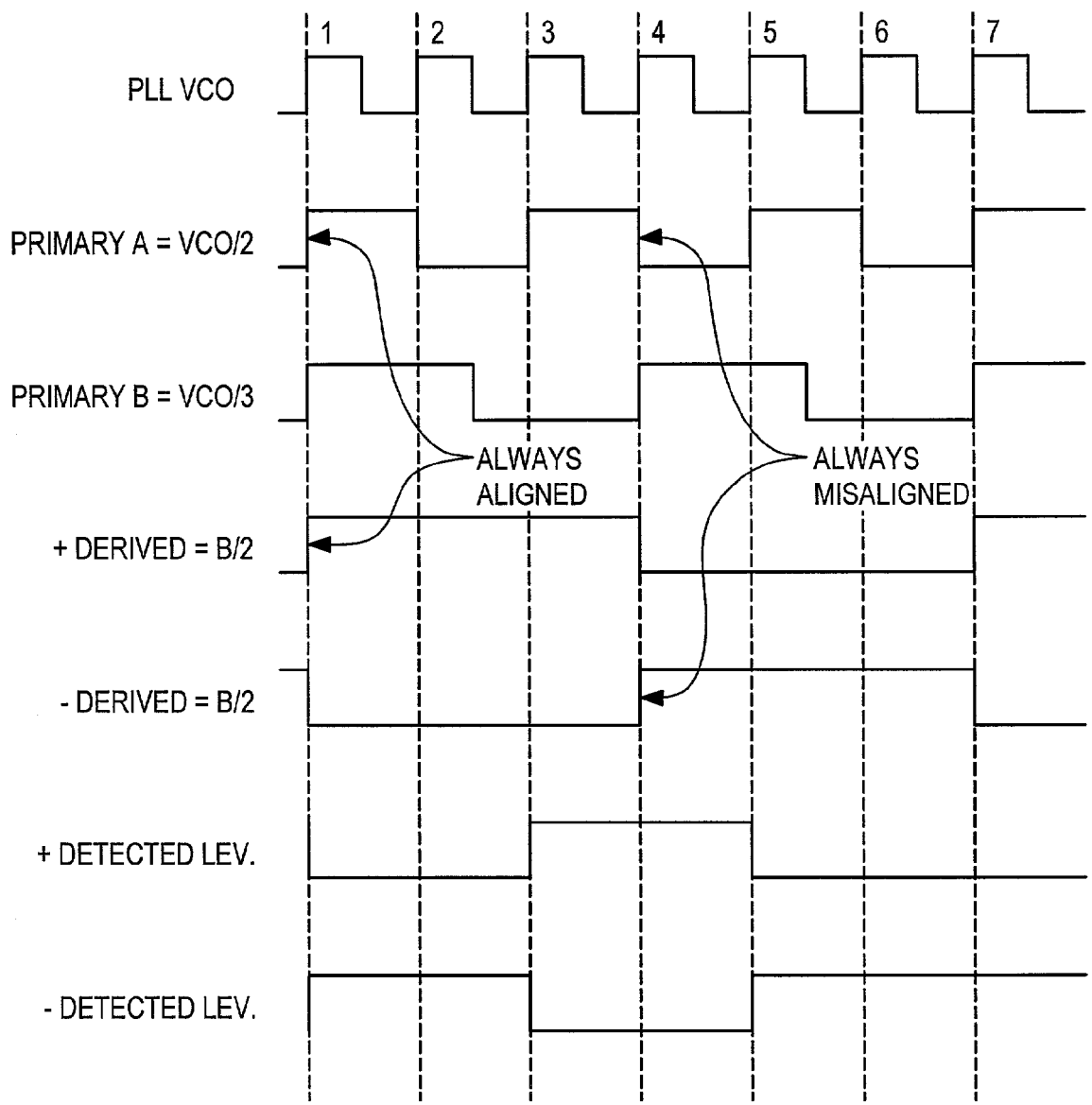
FIG. 3 illustrates timing of various signals of FIG. 1, according to an embodiment.

Referring now to FIG. 3, a timing diagram is shown which illustrates in more detail certain relationships among the clocks of FIG. 1, according to an embodiment. The PLL 110 has a voltage control oscillator ("VCO"), shown in FIG. 3 but not explicitly shown in FIG. 1, from which the clocks primary A and primary B are generated. In the embodiment, the frequency of the primary A clock is one-half that of the VCO, and the frequency of the primary B clock is one-third that of the VCO. Accordingly, at the beginning of the first cycle of the VCO shown in FIG. 3 the rising the edges of the primary A and primary B clocks are aligned. Then, at the beginning of the seventh cycle of the VCO the rising edges of the primary A and primary B clocks are once again aligned.

The frequency of the derived clock, which is output by clock divider 140, is one-half that of the primary B clock. Two possible polarities of the derived clock, positive ("+") and negative ("−"), are shown. Depending on the polarity of the derived clock, the derived clock may or may not be aligned periodically with the primary A clock. That is, a rising edge of the derived clock having positive polarity is always aligned with a rising edge of the primary A clock, while a rising edge of the derived clock having negative polarity is never aligned with a rising edge of the primary A clock. Alignment logic 104 (FIG. 1) ensures that the derived clock is periodically aligned with the primary A clock as is the positive polarity version of the derived clock shown in FIG. 3.

Referring again to FIG. 1, alignment logic 104 includes edge detect flip-flop 135, which processes the derived clock and is clocked by primary A clock, output by splitter 115. That is, edge detector 135 samples the derived clock at rising edges of primary A clock. Since the primary A and primary B clocks are sourced by the same PLL, they may be tightly controlled to within about 50 picoseconds of one another. Notice that the flip timer 125, edge counter 130, edge detector 135 and state machine 150 are all timed by primary A clock; while the clock divider 140 and synchronizer 145 are all timed by the primary B clock. There are only two signals in logic 100 that are exchanged by elements timed by different primary clocks. Specifically, clock divider 140 sends the derived clock signal to the edge detector 135, and state machine 150 sends the flip signal to synchronizer 145. The flip signal is not timing critical, and standard asynchronous design techniques can be used to cross the timing boundary between primary A and primary B clocks. Thus, for the only elements that are clocked by different primary clocks and that exchange a timing critical signal (the derived clock), there is a simple register-to-register path between the clock divider 140 and the edge detector 135. This permits extremely high-speed operation of the circuitry for logic 100 without time consuming and difficult physical design.

Figure 4:
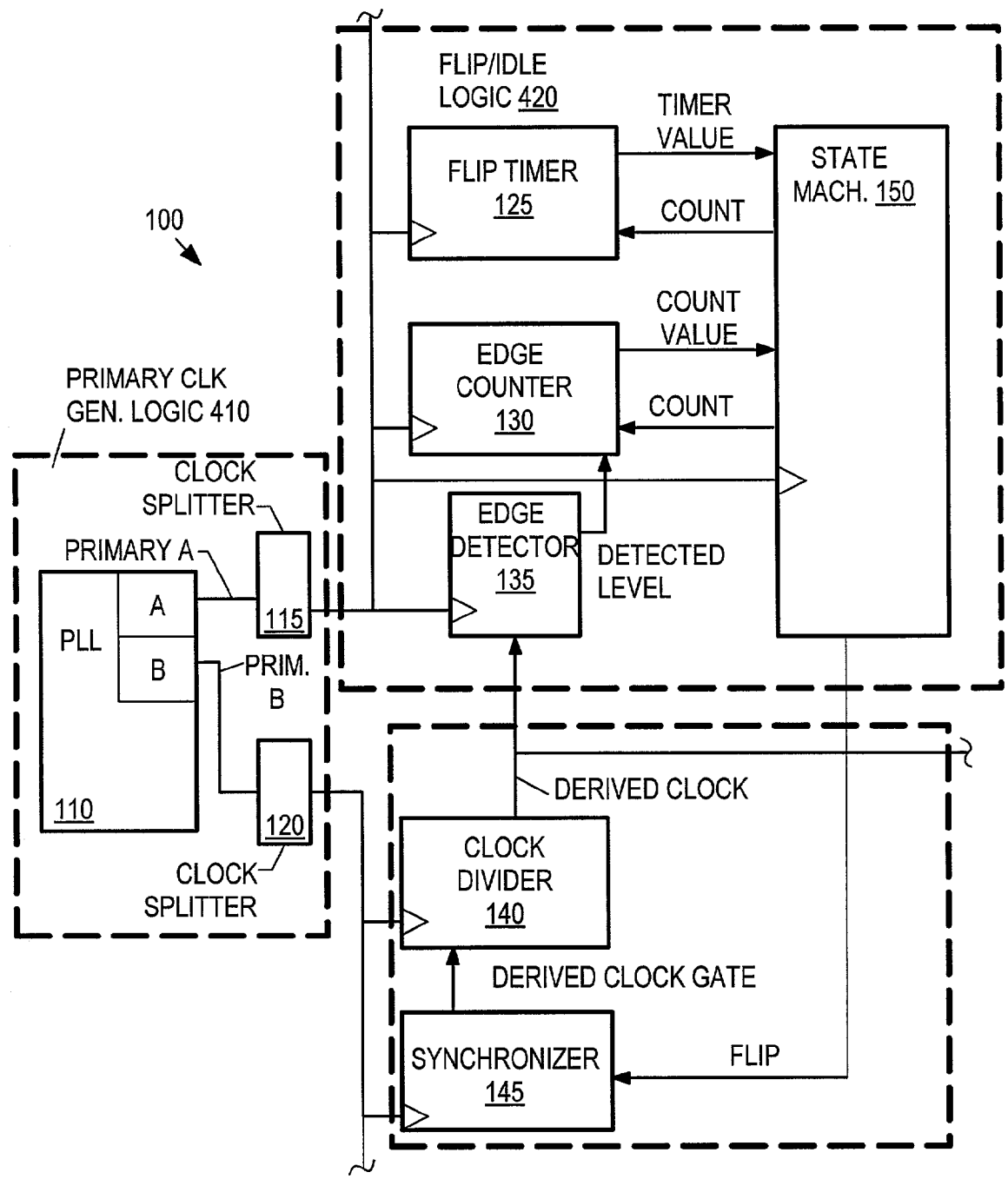
FIG. 4 illustrates logic of FIG. 1 with elements arranged in different functional groupings, according to an embodiment.

Referring now to FIG. 4, another functional grouping of the elements of logic 100 is illustrated, according to an embodiment. This grouping serves to highlight the timing issues described above. According to this grouping, primary clock generating logic 410 includes PLL 110 and the two clock splitters 115 and 120, for generating the primary A and B clocks. The primary B clock is fed to clock divider 140, which responsively generates the derived clock, and to the synchronizer 145. Detection logic 420 receives the primary A clock and the derived clock, compares them, and generates an output signal, flip, in response. The flip signal is fed to the synchronizer, which generates an output signal, derived clock gate, that is fed back to the clock divider. More specifically, operation of the detection logic 420 is as follows, according to the illustrated embodiment.

In each cycle of logic operations for state machine 150, signals are latched responsive to a rising edge of primary A clock. Among other things, the machine 150 latches its own current state, an external signal "ext," the timer value output by flip timer 125, and the edge counter output by edge counter 130.

Figure 2:
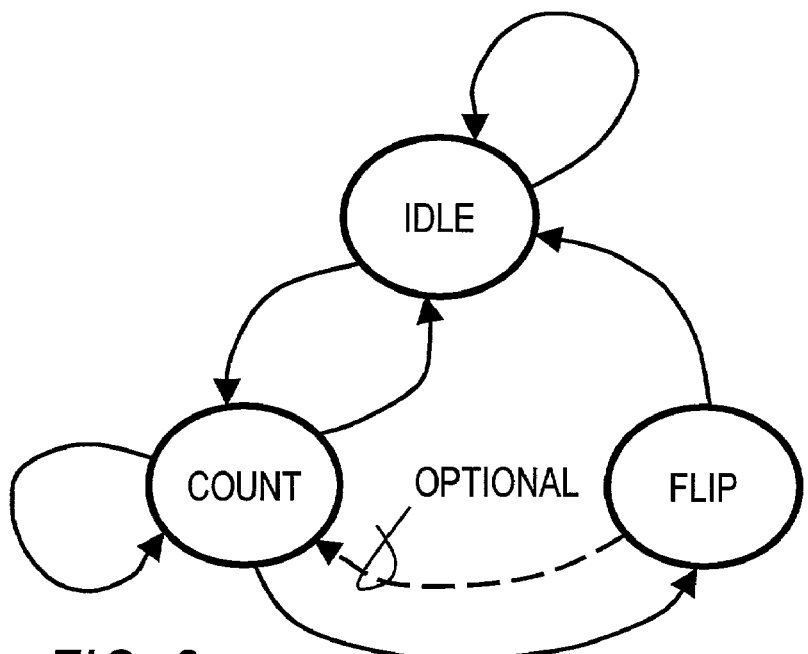
FIG. 2 illustrates a state diagram for the state machine of FIG. 1, according to an embodiment.
Figure 5:
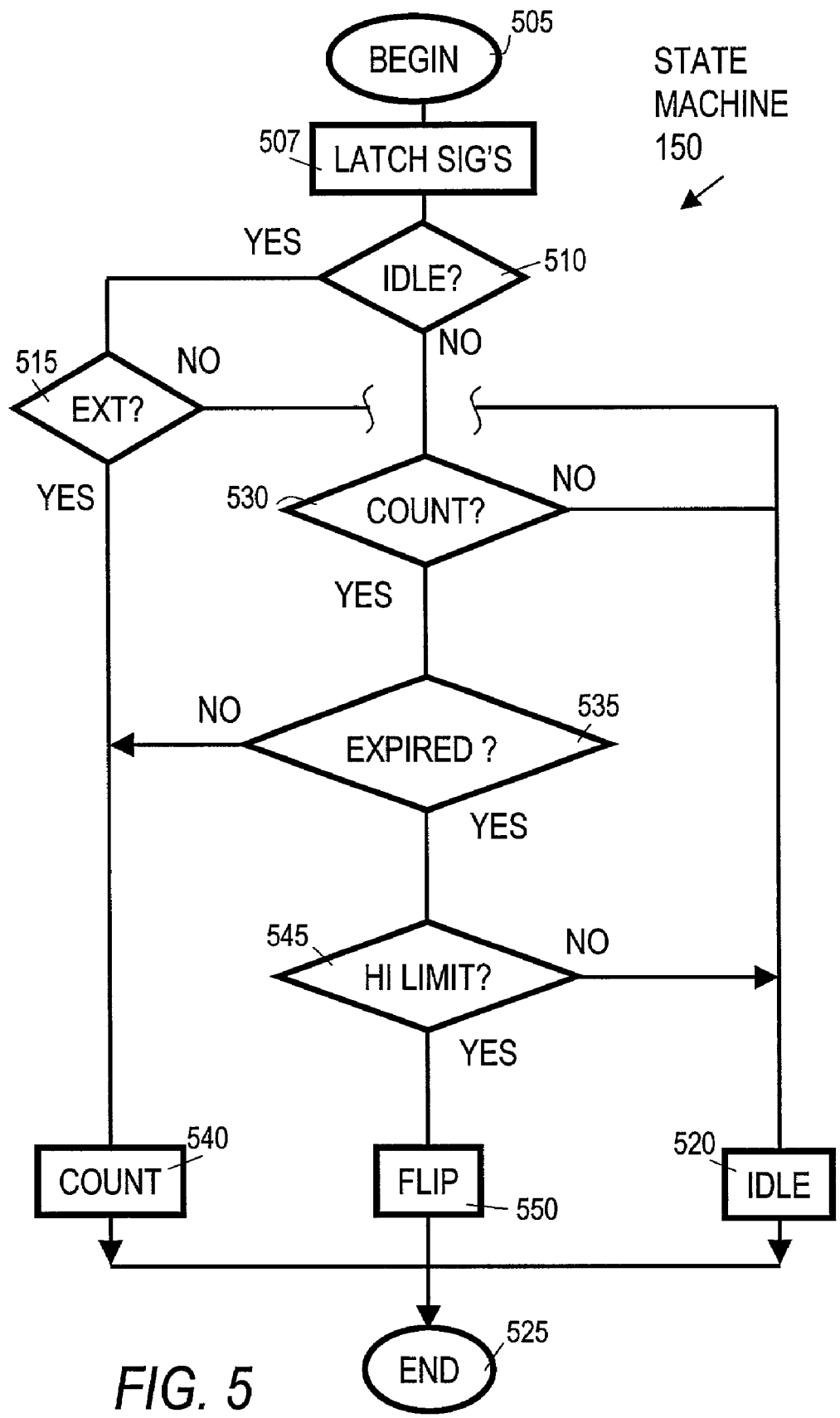
FIG. 5 illustrates a flow chart for logic operations of the state machine, according to an embodiment.

Referring to FIG. 5, logic operations for the state machine 150 are set out in a flow chart according to an embodiment. (In the following description, refer also to FIG. 4 for numbered logic elements. See also the state diagram of FIG. 2.) The logic operations are performed each cycle on the latched signals. It should be understood that this flow chart and the ones that follow are figurative, i.e., logic operations are not necessarily performed in precisely the sequences set out. After beginning at 505, the previously mentioned signals are latched at 507, and then the state of the machine 150 is checked at 510 for the idle state. If idle, the state machine 150 checks at 515 for an asserted external signal, ext. Responsive to the ext signal being asserted the machine 150 goes to the count state 540, and the logic operations end for this cycle at 525. Responsive to the ext signal not being asserted the machine 150 goes to, i.e., remains in, the idle state 520, and the logic operations end for this cycle at 525. If not idle at 510, then the state of the machine 150 is checked at 515 for the count state. If in the count state, the machine 150 checks at 535 to see if the timer value is expired, i.e., equal to zero. If greater than zero, the machine 150 stays in the count state at 540 and ends at 525. If the timer value is zero, the machine checks at 545 the count value output by edge counter 130. If the count value has reached a high limit, the machine 150 goes to the flip state 550 and then ends at 525, or otherwise goes to the idle state 520 and then ends at 525.

An implication of the arrangement just described is that once the state machine 150 is in the flip state, upon the next rising edge of primary A clock the machine 150 returns to the idle state at 520. Note that for the machine 150 the idle check at 510 and the count check at 530 are decision points traversed by the machine immediately after each rising edge of primary A clock, and not machine states as are 540, 550 and 520. The state machine 150 deasserts the count signal (shown in FIGS. 1 and 4) if the machine 150 is in the idle 520 or flip 550 state to indicate that the flip timer and edge counters should assume their reset value, and asserts this signal if the machine 150 is in the count 540 state to indicate that counting should occur. The state machine 150 asserts the flip signal (shown in FIGS. 1 and 4) if the machine 150 is in the flip state, and deasserts the signal if the machine 150 is in the count or idle state.

Referring again to FIG. 4, the edge detector 135 of logic 420 generates an output signal, "detected level," responsive to the derived clock and the primary A clock. Specifically, edge detector 135 outputs, as the detected level signal, the state of the derived clock latched upon the occurrence of each rising edge of the primary A clock. As shown in FIG. 3, when both the primary A clock and the derived clock appear to transition simultaneously, the sampled value of the derived clock is the value immediately preceding the transition. For example, referring to FIG. 3, the edge detector 135 output, + detected level, is shown for sampling the positive polarity derived clock. That is, for the first rising edge of the primary A clock the positive polarity derived clock value immediately before the transition is low, so the detected level is latched low. For the next rising primary A clock edge the positive derived clock is high, then low, and low again. For the negative derived clock the result is the opposite, as may be seen by the – detected level signal in FIG. 3.

Referring now to the edge counter 130, signals are latched responsive to a rising edge of primary A clock for each cycle of logic operations for edge counter 130. Among other things, the edge counter 130 latches the count signal from the state machine 150 and the detected level signal from the edge detector 135.

Figure 6:
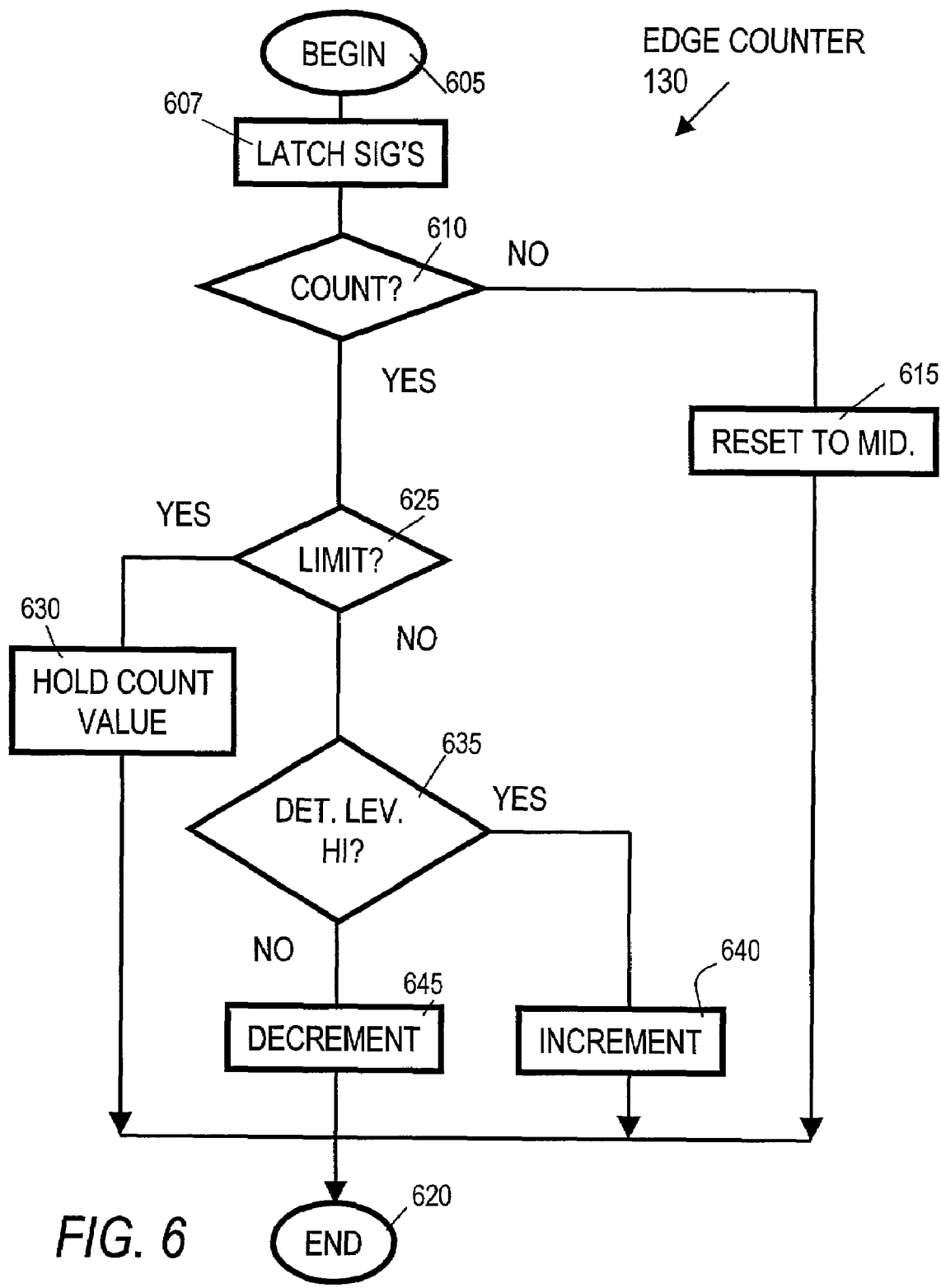
FIG. 6 illustrates a flow chart for logic operations of an edge counter, according to an embodiment.

Referring to FIG. 6, logic operations for the edge counter 130 are set out in a flow chart, according to an embodiment. (In the following description, refer also to FIG. 4 for numbered logic elements. See also the state diagram of FIG. 2.) The logic operations are performed each cycle on the latched signals. In the embodiment, the edge counter 130 flow chart begins at 605, the previously mentioned signals are latched at 607, and then at 610 checks the count signal from the state machine 150. It the count signal is deasserted, the edge counter 130 resets its count value to a middle value at 615 and then ends at 620. If the count signal is asserted, however, the count value of counter 130 is checked at 625 to see if it has reached a high or low limit. If not, then at 635 the counter 130 checks the detected level output by edge detector 135. If high, the count value is incremented at 640 and ends at 620. If low, the count value is decremented at 645 and ends at 620. If at 625 the counter 130 has reached a high or low limit, the counter holds the existing count value at 630 and ends at 620.

Refer again to FIG. 4, and specifically the flip timer 125. The flip timer 125 latches signals responsive to a rising edge of primary A clock for each cycle of logic operations. Among other things, the flip timer 125 latches the count signal from the state machine 150.

Figure 7:
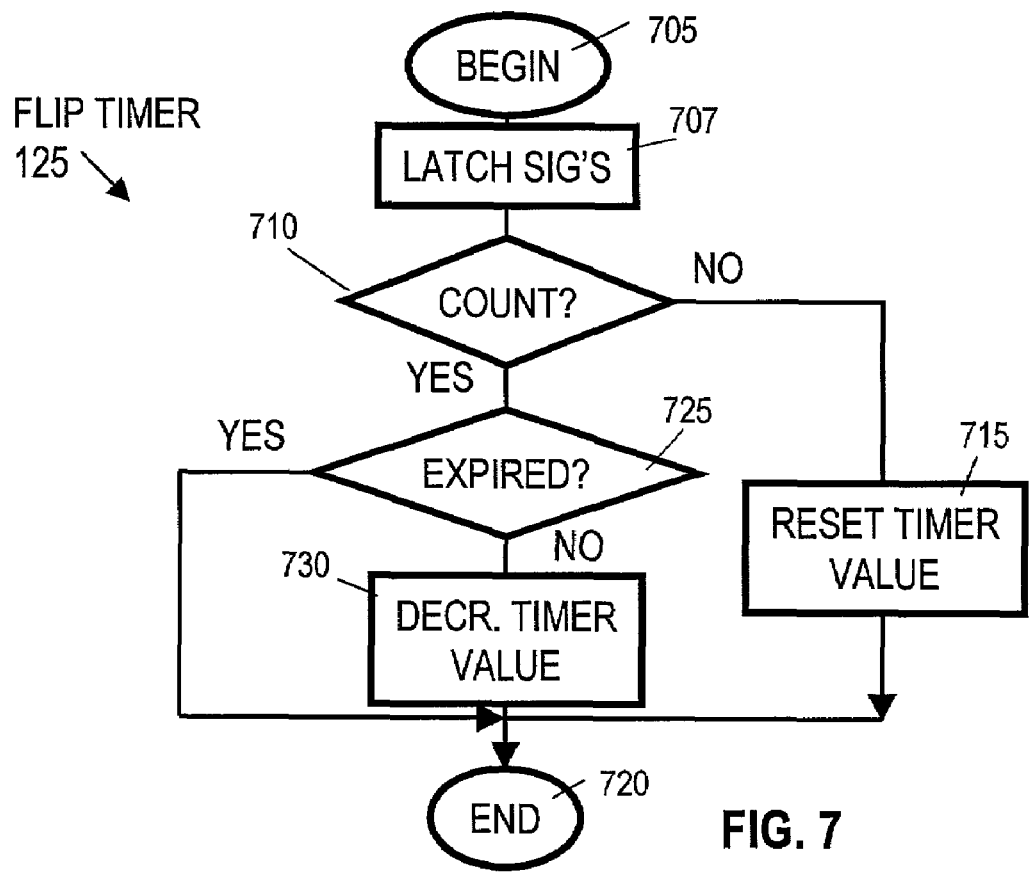
FIG. 7 illustrates a flow chart for logic operations of a flip timer, according to an embodiment.

Referring to FIG. 7, logic operations for the flip timer 125 are set out figuratively in a flow chart, according to an embodiment. (In the following description, refer also to FIG. 4 for numbered logic elements. See also the state diagram of FIG. 2.) The logic operations are performed each cycle on the latched signals. In the embodiment, the flip timer 125 flow chart begins at 705, the previously mentioned signals are latched at 707, and then at 710 the count signal is checked to see if the state machine 150 is indicating that the flip timer should be counting. If no, then at 715 the flip timer 125 resets its timer value to a certain starting value and then ends at 720. If yes, then at 725 the flip timer 125 checks to see if the timer value has reached zero, that is, has expired. If no, the flip timer 125 decrements its timer value at 730 and ends at 720. If yes, the flip timer 125 does not change the timer value, i.e., holds the timer value at zero, and ends at 720.

Refer again to FIG. 4, and specifically the synchronizer 145. In the embodiment, the synchronizer 145 includes a latch clocked by a rising edge of primary B clock that latches the flip signal from the state machine 150. (As previously described, the primary B clock is tightly controlled by the PLL 110 to be closely synchronized to the primary A clock.)

Figure 8:
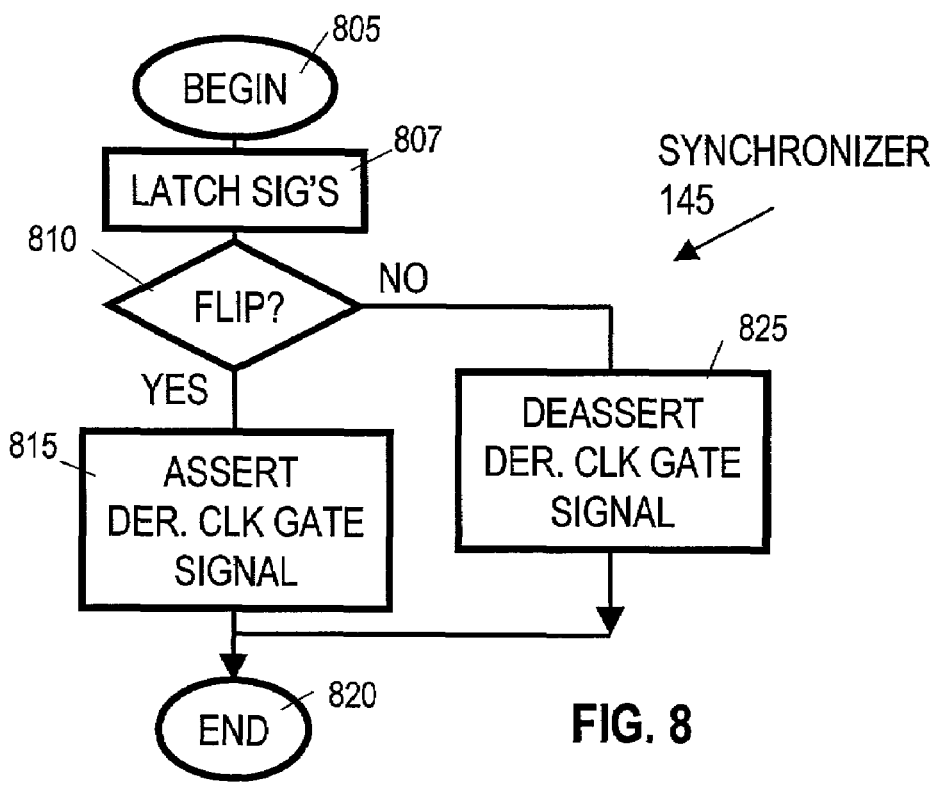
FIG. 8 illustrates a flow chart for logic operations of a synchronizer, according to an embodiment.

Referring to FIG. 8, logic operations for the synchronizer 145 are set out figuratively in a flow chart, according to an embodiment. (In the following description, refer also to FIG. 4 for numbered logic elements. See also the state diagram of FIG. 2.) The logic operations are performed each cycle on the latched signals. In the embodiment, the synchronizer 145 flow chart begins at 805 and then the previously mentioned signals are latched at 807. Then, at 810 the flip signal is checked. If the signal is asserted, indicating that the detection logic 420 is requesting a flip operation, then at 815 the synchronizer asserts its output signal, derived clock gate, until the next logic cycle, i.e., until the next rising edge of primary B clock. If the signal is not asserted, then at 825 the synchronizer deasserts its output signal, derived clock gate, until the next logic cycle. The flow chart ends the cycle of logic operations at 820.

Refer again to FIG. 4, and specifically the clock divider 140. In the embodiment, the clock divider 140 includes a latch clocked by a rising edge of primary B clock that latches the derived clock gate signal from the synchronizer 145 and the primary B clock signal from the PLL 110 via clock splitter 120. The clock divider 140 generates the derived clock signal responsive to the primary B clock and at one half the frequency of the primary B clock, as was described herein above and shown in FIG. 3.

Figure 9:
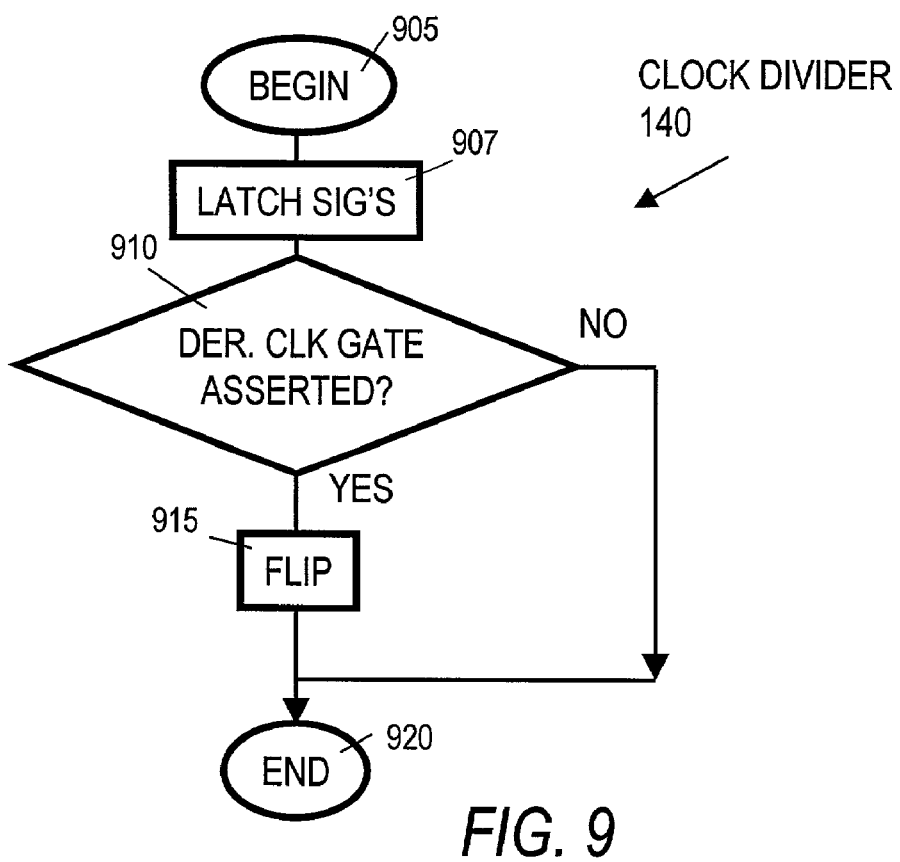
FIG. 9 illustrates a flow chart for logic operations of a clock divider, according to an embodiment.

Referring to FIG. 9, logic operations for the clock divider 140 are set out figuratively in a flow chart, according to an embodiment. (In the following description, refer also to FIG. 4 for numbered logic elements.) The logic operations are performed each cycle on the latched derived clock gate signal and the latched primary B clock signal. In the embodiment, the clock divider 140 flow chart begins at 905 and then the previously mentioned signals are latched at 907. Then, at 910 the clock divider 140 checks to see if the derived clock gate signal is asserted. If yes, then at 915 the clock divider 140 gates (i.e. holds the current state of) the derived clock signal. If no, then the clock divider 140 does not gate the derived clock signal. Irrespective of whether gating occurs, the clock divider 140 flow chart ends at 920.

The description of the present embodiment has been presented for purposes of illustration, but is not intended to be exhaustive or to limit the invention to the form disclosed. Many additional aspects, modifications and variations are also contemplated and are intended to be encompassed within the scope of the following claims. For example, in an embodiment described in detail herein the clock divider 140 divides by two. In this circumstance, the single assertion of the derived clock gate signal by the synchronizer 145, and corresponding single phase adjustment by clock divider 140, is sufficient to ensure periodic phase alignment between the derived clock and the primary A clock. In other embodiments, where the clock divider 140 divides by more than two, more than one flipping may be needed. In such an embodiment, once the state machine 150 is in the flip state it goes to the count state upon the next primary A clock rising edge, rather than to the idle state, so that if the flip timer 125 timer value again goes to zero and the count value again goes to the high limit the state machine will once again return to the flip state, assert the flip signal, cause the synchronizer to assert the derived clock gate signal, causing the clock divider 140 to once again adjust the phase of the derived clock. This process can continue through multiple iterations until proper clock alignment is attained.

What is claimed is:

1. A method for aligning clock signals, the method comprising the steps of:
   a) receiving first and second clock signals by respective first and second logic circuitry, wherein the first and second clock signals are substantially synchronized and operations of the first logic circuitry and second logic circuitry are clocked by the respective first and second clock signals;
   b) receiving, by the first logic circuitry, a third clock signal, wherein the third clock signal is derived from the second clock signal;
   c) repeatedly sampling the third clock signal with the first clock signal, using the first logic circuitry;
   d) detecting relative phase relations of the first and third clock signals repeatedly by the first logic circuitry; and
   e) altering the phase of the third clock signal responsive to an accumulation of the phase relation detecting.

2. The method of claim 1, wherein step e) includes altering the phase responsive to the accumulated detections indicating that the first and third clock signals are more often out-of-phase with one another than in-phase.

3. The method of claim 1, wherein the first logic circuitry includes a state machine, a flip timer and an edge counter, and step d) comprises the steps of:
   latching certain signals for the state machine in cycles of logic operations responsive to a certain edge of the first clock, wherein the certain signals include the state machine's own initial state in a cycle, an external signal, a timer value output by the flip timer, and an edge counter signal output by the edge counter;
   asserting a count signal by the state machine if the machine requires the flip timer or edge counter to count; and
   asserting a flip signal by the state machine if the machine indicates an adjustment of phase.

4. The method of claim 3, comprising the steps of:
   ending in the idle state for a logic cycle of the state machine if an initial state of the machine for the logic cycle is idle and the external signal is not asserted;
   ending in the count state for the logic cycle of the state machine if the initial state of the machine for the logic cycle is idle and the external signal is asserted;

ending in the count state for the logic cycle of the state machine if the initial state of the machine for the logic cycle is the count state and the flip timer value is greater than zero;

ending in the flip state for the logic cycle of the state machine if the initial state of the machine for the logic cycle is the count state and the flip timer value is zero and the edge counter count value has reached a high limit; and ending in the idle state for the logic cycle of the state machine if the initial state of the machine for the logic cycle is the count state and the flip timer value is zero and the edge counter count value has not reached a high limit.

5. The method of claim 3, wherein the first logic includes an edge detector, and step c) comprises outputting, as a detected level signal by the edge detector, the phase relation of the third clock to the first clock, wherein the third clock state is latched responsive to each one of a certain edge of the first clock.

6. The method of claim 5, wherein step d) further comprises the steps of: latching signals for the edge counter, including the count signal from the state machine and the detected level signal from the edge detector, responsive to the certain edge of the first clock for each cycle of logic operations; resetting the edge counter to a certain middle value during a logic cycle as indicated by the count signal of the state machine. incrementing the edge counter during the logic cycle if the count signal indicates the state machine requires counting, and the edge counter has not reached a high or low limit, and the detected level output by edge detector is high; decrementing the edge counter during the logic cycle if the count signal indicates the state machine requires counting, and the edge counter has not reached a high or low limit, and the detected level output by edge detector is low; holding the edge counter during the logic cycle if the count signal indicates the state machine requires counting, and the edge counter has reached a high or low limit.

7. The method of claim 3, wherein step d) further comprises the steps of: latching signals for the flip timer, including the count signal from the state machine, responsive to a certain edge of the first clock for each cycle of logic operations; resetting the flip timer to a certain starting value during a logic cycle if the count signal indicates the state machine does not require counting down; decrementing the flip timer during a logic cycle if the count signal indicates the state machine requires counting down; and holding the flip timer during a logic cycle if the count signal indicates the state machine requires counting down and the flip timer has expired.

8. The method of claim 3, wherein the second logic includes a synchronizer, and step d) further comprises the steps of: latching certain signals for the synchronizer, including the flip signal from the state machine, responsive to a certain edge of the second clock for each cycle of logic operations; and asserting a derived clock gate output signal for the synchronizer if the flip signal indicates that the state machine indicates a phase adjustment.

9. The method of claim 8, wherein the second logic circuitry includes a clock divider, and step e) comprises the steps of:

latching, for the clock divider, the derived clock gate signal from the synchronizer responsive to a certain edge of the second clock; and adjusting the phase of the derived clock signal if the derived clock gate signal is asserted.

10. Apparatus for aligning clock signals, the apparatus comprising:

first and second logic circuitry for receiving respective first and second clock signals, wherein the first and second clock signals are substantially synchronized and operations of the first logic circuitry and second logic circuitry are clocked by the respective first and second clock signals, wherein the first logic circuitry receives a third clock signal derived from the second clock signal, and by repeatedly sampling the third clock signal using the first, the first logic circuitry repeatedly detects relative phase relations of the first and third clock signals, and wherein the second logic circuitry adjusts the phase of the third clock signal responsive to an accumulation of the phase relation detecting.

11. The apparatus of claim 10, wherein the adjustment of phase responsive to an accumulation of the phase relation detecting includes phase adjustment responsive to the accumulated detections indicating that the first and third clock signals are more often out-of-phase with one another than in-phase.

12. The apparatus of claim 10, wherein the first logic circuitry includes a state machine, a flip timer and an edge counter, and repeatedly detecting relative phase relations comprises latching certain signals for the state machine in cycles of logic operations responsive to a certain edge of the first clock, wherein the certain signals include the state machine's own initial state in a cycle, an external signal, a timer value output by the flip timer, and an edge counter signal output by the edge counter; and wherein the state machine asserts a count signal if the machine requires counting and asserts a flip signal if the machine requires an adjustment of phase.

13. The apparatus of claim 12, wherein the state machine ends i) in an idle state for a logic cycle if an initial state of the machine for the logic cycle is idle and the external signal is not asserted, ii) in a count state for the logic cycle if the initial state of the machine for the logic cycle is idle and the external signal is asserted, iii) in a count state for the logic cycle if the initial state of the machine for the logic cycle is the count state and the flip timer value is greater than zero, iv) in a flip state for the logic cycle if the initial state of the machine for the logic cycle is the count state and the flip timer value is zero and the edge counter count value has reached a high limit, and v) in the idle state for the logic cycle if the initial state of the machine for the logic cycle is the count state and the flip timer value is zero and the edge counter count value has not reached a high limit.

14. The apparatus of claim 12, wherein the first logic includes an edge detector, and repeatedly sampling the third clock using the first clock comprises outputting by the edge detector, as a detected level signal, the state of the third clock, wherein the third clock state is latched responsive to each instance of a certain edge of the first clock.

15. The apparatus of claim 14, wherein detecting relative phase relations of the first and third clocks comprises latching signals for the edge counter, including the count signal from the state machine and the detected level signal from the edge detector, responsive to the certain edge of the first clock for each cycle of logic operations, resetting the edge counter to a certain middle value during a logic cycle if the count signal indicates the state machine does not require counting, incrementing the edge counter during the logic cycle if the count signal indicates the state requires counting and the edge counter has not reached a high or low limit and the detected level output by edge detector is high, decrementing the edge counter during the logic cycle if the count signal indicates the state machine requires counting and the edge counter has not reached a high or low limit and the detected level output by edge detector is low, and holding the edge counter during the logic cycle if the count signal indicates the state machine requires counting, and the edge counter has reached a high or low limit.

16. The apparatus of claim 12, wherein detecting relative phase relations of the first and third clocks comprises latching signals for the flip timer responsive to a certain edge of the first clock for each cycle of logic operations, including the count signal from the state machine, resetting the flip timer to a certain starting value during a logic cycle if the count signal indicates the state machine does not require counting, decrementing the flip timer during a logic cycle if the count signal indicates the state machine requires counting and the flip timer has not expired, and holding the flip timer during a logic cycle if the count signal indicates the state machine requires counting and the flip timer has expired.

17. The apparatus of claim 12, wherein the second logic includes a synchronizer, and detecting relative phase relations of the first and third clocks comprises latching certain signals for the synchronizer responsive to a certain edge of the second clock for each cycle of logic operations, wherein the certain signals include the flip signal from the state machine, and asserting a derived clock gate output signal for the synchronizer if the flip signal indicates that the state machine requires a phase adjustment of the derived clock.

18. The apparatus of claim 17, wherein the second logic circuitry includes a clock divider, and phase adjustment of the third clock signal comprises latching, for the clock divider, the derived clock gate signal from the synchronizer responsive to a certain edge of the second clock, and gating of the derived clock signal if the derived clock gate signal is asserted.

19. Apparatus for aligning clock signals, the apparatus comprising:
first and second logic circuitry for receiving respective first and second clock signals, wherein the first and second clock signals are substantially synchronized and operations of the first logic circuitry and second logic circuitry are clocked by the respective first and second clock signals, wherein the first logic circuitry includes a state machine, a flip timer, an edge counter and edge detector, and receives a third clock signal derived from the second clock signal, wherein by repeatedly sampling third clock signal with the first, the first logic circuitry repeatedly detects relative phase relations of the first and third clock signals, and wherein the second logic circuitry includes a clock divider and a synchronizer, and the second logic circuitry adjust the phase of the third clock signal responsive to an accumulation of the phase relation detecting, and wherein phase adjustment of the third clock signal comprises latching, for the clock divider, a signal from the synchronizer responsive to a certain edge of the second clock, and phase adjustment of the derived clock signal if the signal from the synchronizer is asserted.

20. The apparatus of claim 19, wherein detecting relative phase relations of the first and third clocks comprises latching signals for the edge counter, including a count signal from the state machine and a detected level signal from the edge detector, responsive to the certain edge of the first clock for each cycle of logic operations, resetting the edge counter to a certain middle value during a logic cycle if the count signal indicates the state machine does not require counting, incrementing the edge counter during the logic cycle if the count signal indicates the state machine requires counting and the edge counter has not reached a high or low limit and the detected level output by edge detector is high, decrementing the edge counter during the logic cycle if the count signal indicates the state machine requires counting and the edge counter has not reached a high or low limit and the detected level output by edge detector is low, and holding the edge counter during the logic cycle if the count signal indicates the state machine requires counting, and the edge counter has reached a high or low limit.

* * * * *